United States Patent
Tissafi Drissi

(10) Patent No.: US 10,153,036 B2
(45) Date of Patent: Dec. 11, 2018

(54) METHOD FOR AUTOCORRECTIVE WRITING TO A MULTIPORT STATIC RANDOM ACCESS MEMORY DEVICE, AND CORRESPONDING DEVICE

(71) Applicant: STMicroelectronics SA, Montrouge (FR)

(72) Inventor: Faress Tissafi Drissi, Crolles (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/461,979

(22) Filed: Mar. 17, 2017

(65) Prior Publication Data

US 2018/0047440 A1  Feb. 15, 2018

(30) Foreign Application Priority Data

Aug. 11, 2016  (FR) ...................... 16 57708

(51) Int. Cl.
*G11C 11/34* (2006.01)
*G11C 11/419* (2006.01)

(52) U.S. Cl.
CPC .... *G11C 11/419* (2013.01); *G11C 2207/2263* (2013.01)

(58) Field of Classification Search
CPC .................................................. G11C 11/419
USPC ........................................................ 365/154
See application file for complete search history.

(56) References Cited

U.S. PATENT DOCUMENTS

| | | | | |
|---|---|---|---|---|
| 7,359,275 B1* | 4/2008 | Wu | ......................... | G11C 8/16 365/154 |
| 2012/0230122 A1* | 9/2012 | Chandra | .................. | G11C 8/08 365/189.04 |
| 2014/0010001 A1* | 1/2014 | Kobatake | .............. | G11C 11/412 365/156 |
| 2014/0157065 A1* | 6/2014 | Ong | ....................... | G11C 29/12 714/718 |
| 2015/0100848 A1* | 4/2015 | Kalamatianos | ..... | G06F 11/1008 714/764 |
| 2015/0255138 A1* | 9/2015 | Rodriguez-Latorre | ..................... | G06F 11/1008 714/766 |
| 2016/0042784 A1 | 2/2016 | Rim et al. | | |

OTHER PUBLICATIONS

INPI Search Report and Written Opinion for FR 1657708 dated May 29, 2017 (7 pages).

\* cited by examiner

*Primary Examiner* — Anthan Tran
(74) *Attorney, Agent, or Firm* — Crowe & Dunlevy

(57) ABSTRACT

An autocorrective writing to a multiport static random access memory device is performed on at least one multiport static random access memory cell circuit. A first datum is written to the multiport static random access memory cell circuit and a second datum stored in the circuit is read from the multiport static random access memory cell subsequent to writing. The first and second data are compared. In response to the results of that comparison, an operation to rewriting the first datum to the circuit along with application of a write assist mechanism is selectively performed.

19 Claims, 5 Drawing Sheets ation claims the priority benefit of French
METHOD FOR AUTOCORRECTIVE WRITING TO A MULTIPORT STATIC RANDOM ACCESS MEMORY DEVICE, AND CORRESPONDING DEVICE

PRIORITY CLAIM

This application claims the priority benefit of French Application for Patent No. 1657708, filed on Aug. 11, 2016, the disclosure of which is hereby incorporated by reference in its entirety.

TECHNICAL FIELD

Modes of implementation and embodiments of the invention relate to static random access memory, or SRAM, cell circuits, and more particularly to multiport SRAM cell circuits, such as circuits comprising dedicated read and write accesses which allow for read and write operations to be carried out in one and the same read/write clock cycle.

BACKGROUND

Because, in particular, of the ever decreasing supply voltage in integrated circuits, random dopant fluctuations (RDFs), deterioration and aging over time, carrier mobility fluctuations, gate oxide thickness fluctuations and channel width fluctuations, it is preferable to employ various read and write assist mechanisms or techniques, in particular the write assist mechanisms that make provision to decrease the positive supply voltage Vdd, to increase the negative supply voltage Vss, to boost word lines and to boost negative bit lines, in order to ensure robust writability to these SRAM cell circuits.

However, these write assist mechanisms are generally permanently applied on a large scale, for example to all of the SRAM cell circuits of a static random access memory, thereby permanently increasing, in particular, the consumption or dynamic power of said static random access memory.

Furthermore, SRAM cell circuits are much more sensitive to the decrease in positive supply voltage Vdd than other standard logic gates, since this voltage Vdd is critical to the correct operation of each transistor in a SRAM cell circuit.

Consequently, it may be detrimental to decrease the supply voltages Vdd for SRAM cell circuits for the purpose of decreasing their dynamic power (consumption).

SUMMARY

Thus, according to one mode of implementation and embodiment, it is proposed to provide a technical solution of low complexity and using a small area of silicon in order to decrease the dynamic power of a multiport SRAM cell circuit while ensuring robust writability to the circuit.

According to a first aspect, a method is proposed for autocorrective writing to a multiport static random access memory device comprising at least one multiport static random access memory cell circuit. The method comprises the following steps: writing a first datum to the circuit; reading a second datum stored in the circuit subsequent to writing; comparing the first and second data; and possibly rewriting the first datum to the circuit with the application of a write assist mechanism, depending on the result of the comparison.

Such a method advantageously allows the result of the write to the circuit to be monitored and an autocorrective rewrite to be carried out with the application of said mechanism only if required.

Stated otherwise, such a method allows the application of said mechanism to be deactivated when it is not required, which is generally in most cases, so as to decrease the consumption (dynamic power) of the circuit.

Furthermore, as each circuit of said device may independently apply the mechanism, the dynamic consumption of such a multiport static random access memory device may therefore be substantially decreased further, and even more so if said memory device comprises a large number of cell circuits.

Advantageously, said step of writing the first datum and said step of reading the second datum may be carried out in one and the same write clock cycle.

According to one mode of implementation, if the first and second data are identical, said step of rewriting with the application of said write assist mechanism for assisting with writing to the circuit is not carried out.

According to another mode of implementation, if the first and second data are different, said step of rewriting the first datum to the circuit is carried out with the application of the write assist mechanism so as to make the first and second data correspond.

Consequently, the write to the static random access memory cell circuit is autocorrected through application of the write assist mechanism. Such a method advantageously ensures that the first and second data are identical.

Any write assist mechanism may be used. Thus, by way of non-limiting example, the write assist mechanism may comprise an application of a negative voltage to write bit lines of said circuit.

In general, the memory device advantageously comprises a matrix plane of cells arranged in rows and columns, the columns being parallel to write bit lines, and the write assist mechanism is applied to the bit lines that are coupled to all of the cell circuits of one and the same column.

According to another aspect, a multiport static random access memory device is proposed, comprising at least one multiport static random access memory cell circuit. Said device comprises: a write circuit configured to write a first datum to the circuit; a read circuit configured to read a second datum stored in the circuit subsequent to writing the first datum; a comparison circuit configured to compare the first and second data; and a processing circuit configured to apply or not to apply a write assist mechanism depending on the result of the comparison.

The write circuit is additionally configured to rewrite, if necessary, the first datum to the circuit with the application of said write assist mechanism.

The write circuit and the read circuit may additionally be configured to write the first datum and read the second datum, respectively, in one and the same write clock cycle.

According to one embodiment, if the first and second data are identical, the processing circuit is configured not to apply the write assist mechanism.

According to another embodiment, if the first and second data are different, the processing circuit is configured to apply the write assist mechanism and the write circuit is configured to rewrite the first datum with the application of the write assist mechanism.

The write assist mechanism may be configured, for example, to apply a negative voltage to the write bit lines.

Advantageously, the device may comprise, for example, a matrix plane of cells arranged in rows and columns. The columns may be parallel to write bit lines. The processing circuit is configured to apply, if necessary, the write assist mechanism to the bit lines that are coupled to all of the cell circuits of one and the same column.

According to another aspect, a system is proposed comprising at least one multiport static random access memory device such as defined above.

According to another aspect, an electronic apparatus, such as a mobile cell phone, tablet, or laptop computer, is proposed, comprising at least one system such as defined above.

BRIEF DESCRIPTION OF THE DRAWINGS

Other advantages and features of the invention will become apparent on examining the detailed description of wholly non-limiting modes of implementation and embodiments and the appended drawings in which.

DETAILED DESCRIPTION

Figure 1:
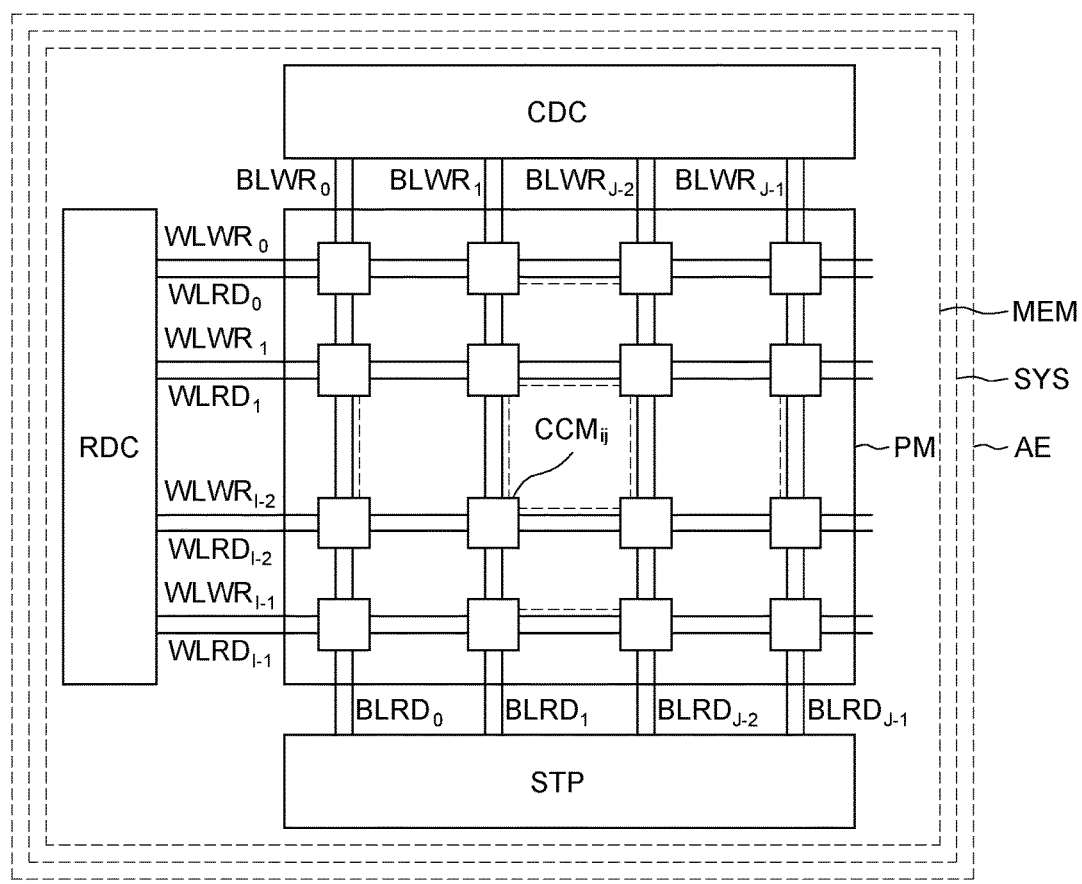
FIG. 1 schematically illustrates an electronic apparatus comprising a static random access memory device.

FIG. 1 schematically illustrates an electronic apparatus AE, for example a mobile cell phone, comprising a processing system SYS, in this instance, for example, a microcontroller, itself comprising a static random access memory device MEM such as, for example, a cache memory of said microcontroller.

The static random access memory device MEM comprises a matrix memory plane PM comprising I rows and J columns of multiport static random access memory cell circuits CCMij.

Each multiport static random access memory cell circuit CCMij is connected or coupled to at least one write word line WLWRi and one read word line WLRDi, and to at least one write bit line BLWRj and one read bit line BLRDj.

The decoding of the word lines WLWRi, WLRDi is carried out by a row decoder RDC and the decoding of the bit lines BLWRj, BLRDj is carried out by a column decoder CDC, both of known and conventional structure.

The matrix memory plane PM is additionally connected or coupled to a programming voltage source STP which delivers the positive supply voltage $V_{dd}$ of the memory cell circuits CCMij.

Figure 2:
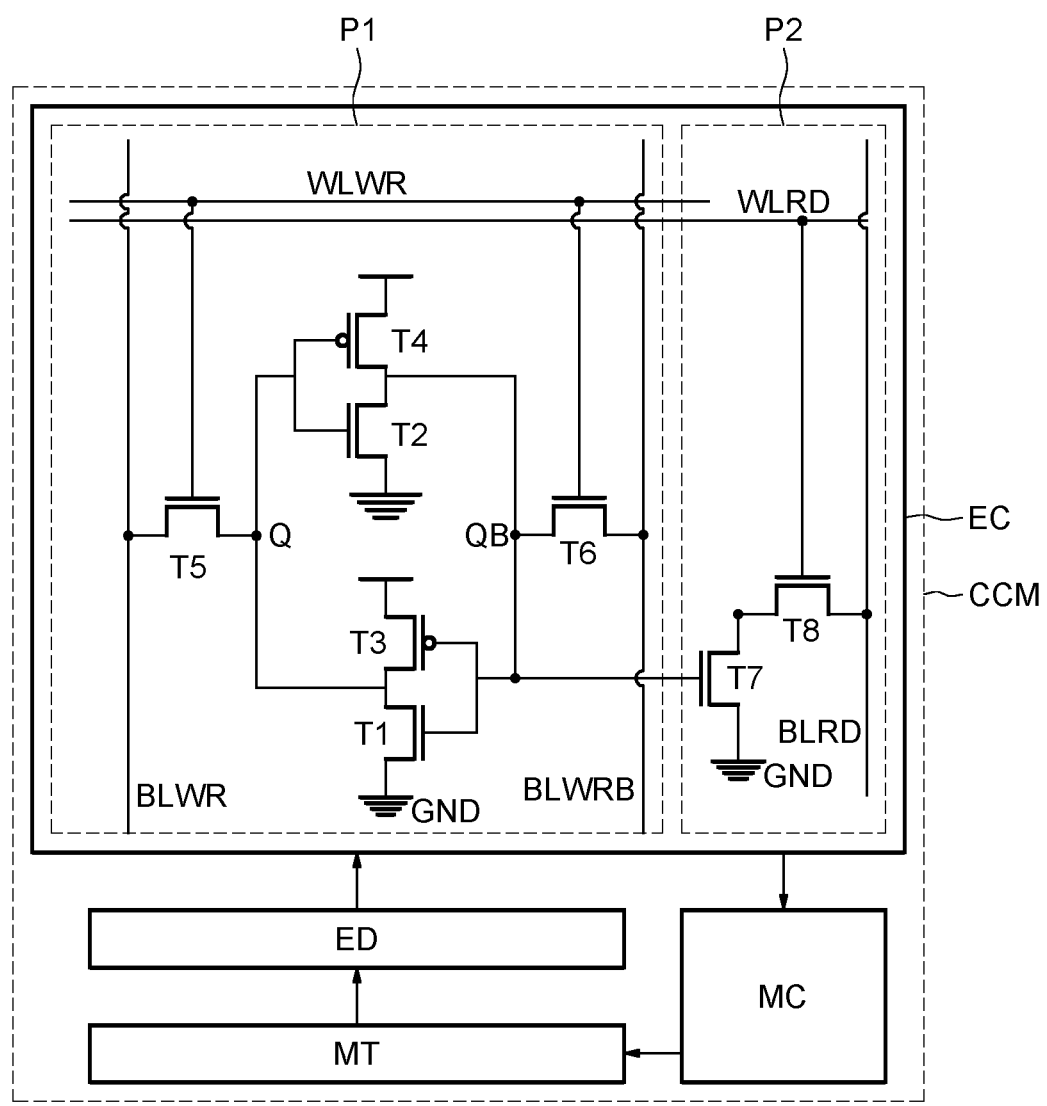
FIG. 2 schematically illustrates a static random access memory cell circuit incorporated into a static random access memory device.

Reference will now be made to FIG. 2 to schematically illustrate a static random access memory cell circuit CCM incorporated into a static random access memory device MEM.

The static random access memory cell circuit CCM comprises a cell stage circuit EC, which in this instance, for example, is a conventional multiport SRAM cell with eight transistors comprising one word-write access WLWR and another word-read access WLRD. This type of multiport SRAM cell is commonly known to those skilled in the art by the acronym 1W1R (one write one read). The storage capacity of the cell stage circuit EC is therefore one datum of one bit.

This cell stage circuit EC comprises a first circuit portion P1 dedicated to holding a datum that it is desired to write to the cell stage circuit EC. This first circuit portion P1 forms a conventional memory cell with six transistors, known per se by those skilled in the art.

The cell stage circuit EC also comprises a second circuit portion P2 dedicated to reading the datum held (stored) in said first portion.

The first circuit portion P1 comprises: two back-to-back-connected inverters of four transistors T1 to T4 forming a latch memory substage making it possible to have a first holding node Q and a second holding node QB respectively representing the logic values 0 and 1 (or 1 and 0) of the datum; and two NMOS access transistors T5 and T6 coupled between a write bit line BLWR and the first holding node Q, and an additional write bit line BLWRB and the second holding node QB, respectively.

The gates of the two access transistors T5 and T6 are coupled to the write word line WLWR.

The second circuit portion P2 of the cell stage circuit EC comprises: a first additional transistor T7 whose gate is coupled, in this instance, to the second holding node QB; and a second additional transistor T8 whose gate is coupled to a dedicated read word line WLRD that is different from the write word line WLWR.

The source of the second additional transistor T8 is coupled to the drain of the first additional transistor T7 and the drain of the second additional transistor T8 is coupled to a dedicated read bit line BLRD that is different from the write bit line BLWR and from the additional write bit line BLWRB.

When the read word line WLRD has not been activated (WLRD=0 V), the path between the read bit line BLRD and ground GND is interrupted, regardless of the value of the datum held in the first circuit portion P1.

It should be noted that the first and second additional transistors T7 and T8 form a read buffer circuit advantageously allowing a near perfect decoupling of the first and second portions P1 and P2.

Figure 3:
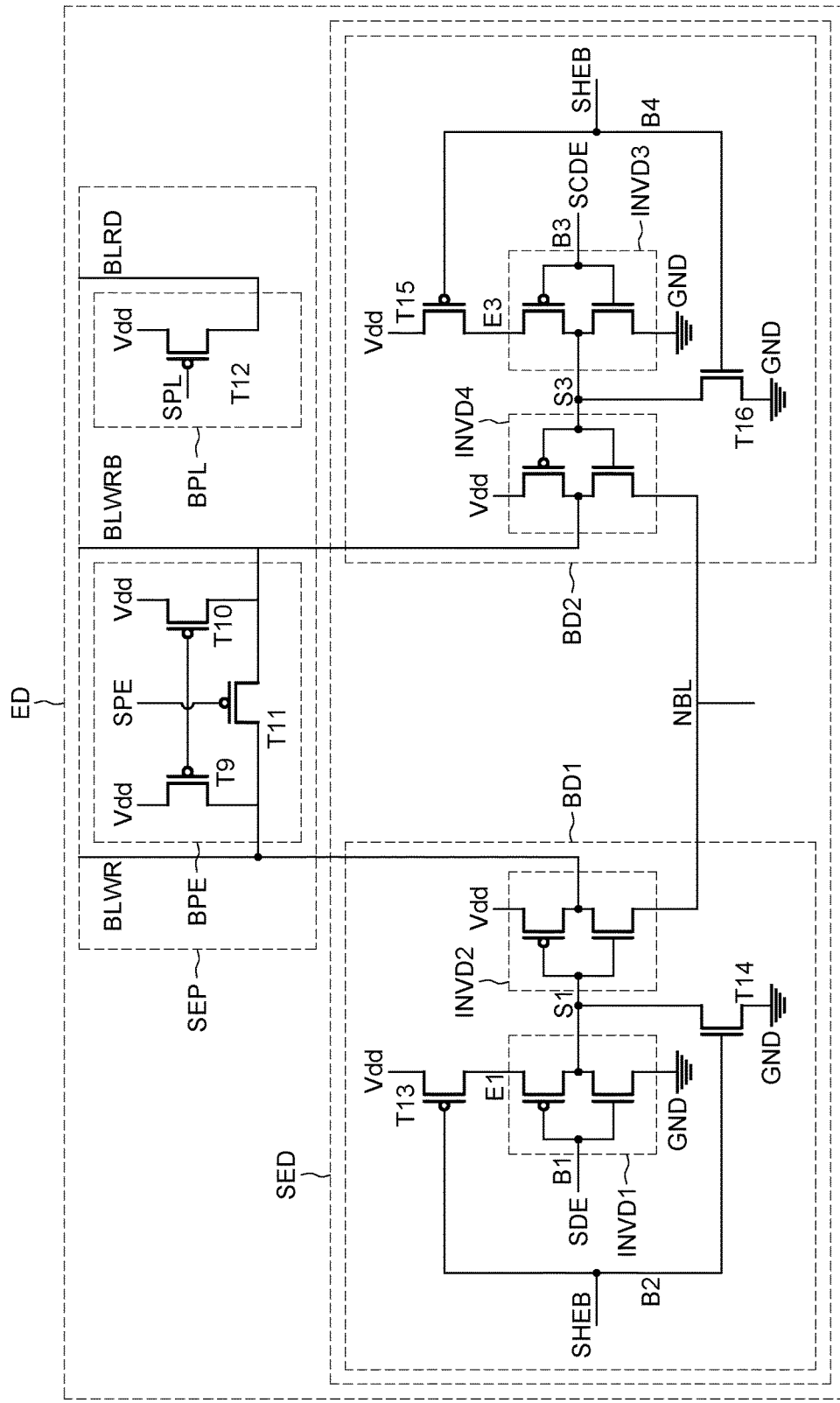
FIG. 3 schematically illustrates a data stage circuit.

The static random access memory cell circuit CCM also comprises a data stage circuit ED coupled to the cell stage circuit EC and intended to deliver, to the cell stage circuit, data that it is desired to write. An exemplary data stage circuit ED is illustrated in FIG. 3.

The data stage circuit ED comprises a precharge substage circuit SEP configured to precharge the cell stage circuit EC in read and write operations. The data stage circuit also comprises a precharge substage circuit SEP configured to receive a datum that it is desired to write to the cell stage circuit EC and to deliver the datum to the cell stage circuit EC via the precharge substage circuit SEP.

Said precharge substage circuit SEP comprises a write precharge circuit block BPE containing first, second and third PMOS write precharge transistors T9 to T11 whose gates are jointly controlled by a write precharge signal SPE.

The drains of the first and second write precharge transistors T9 and T10 are coupled to the positive supply voltage Vdd. The source of the first write precharge transistor T9 is coupled to the source of the third write precharge transistor T11 and to the write bit line BLWR. The drain of the second write precharge transistor T10 is coupled to the drain of the third write precharge transistor T11 and to the additional write bit line BLWRB.

The signal SPE is configured by default to be in its low state and an additional write clock signal SHEB is configured to be in its high state so as to allow the write bit lines BLWR and BLWRB to be precharged to a high state.

While the cell stage circuit EC is being written, the write bit line BLWR is precharged to a state corresponding to the value of the datum that it is desired to write to the cell stage circuit EC and the additional write bit line is precharged to a state corresponding to the additional logic value of the datum. The write precharge signal SPE is configured to be in its high state and the signal SHEB is configured to be in its low state so as to allow the write bit line BLWR and the additional write bit line BLWRB to be precharged according to the value of the datum before activation of the write word line WLWR.

The precharge substage circuit SEP also comprises a read precharge circuit block BPL containing a read precharge transistor T12 whose gate is controlled by a read precharge signal SPL, whose drain is coupled to the supply voltage Vdd and whose source is coupled to the read bit line BLRD.

The read precharge signal SPL is configured by default to be in its low state so as to allow a high state on the read bit line BLRD to be obtained.

To read the cell stage circuit EC, the read precharge signal SPL is configured to be in its high state so as to turn off the precharge transistor T12 and allow the read bit line BLRD to be controlled by the cell EC.

If the logic value of the datum held in the cell stage circuit EC is high (Q=1) and the read word line WLRD has been activated, the first additional transistor T7 is not on and the read bit line BLRD is not discharged (in an ideal case). Consequently, a high voltage is obtained across the read bit line BLRD.

In the case in which the first holding node Q is at 0 and the read word line WLRD has been activated, the path between the read bit line BLRD and ground GND is conductive. The read bit line BLRD is therefore discharged and a low value is obtained on the read bit line BLRD.

The precharge substage circuit SEP comprises a first data circuit block BD1 intended to receive a data signal SDE representing a first datum to be written and a second data circuit block BD2 intended to receive the additional data signal SCDE.

The first data circuit block BD1 comprises a first and a second data inverter INVD1 and INVD2, which are coupled in series between the write bit line BLWR and a first terminal B1 intended to receive said data signal SDE.

The first data circuit block BD1 additionally comprises a second terminal B2 intended to receive the additional write clock signal SHEB and which is coupled to the input of the positive power source E1 of the first data inverter INVD1 and to the output S1 of the first data inverter INVD1 via a PMOS first additional data transistor T13 and via an NMOS second additional data transistor T14, respectively.

The second data circuit block BD2 comprises a third and a fourth data inverter INVD3 and INVD4, which are coupled in series between the additional write bit line BLWRB and a third terminal B3 intended to receive said additional data signal SCDE.

The second data circuit block BD2 additionally comprises a fourth terminal B4 intended to receive the additional write clock signal SHEB and which is coupled to the input of the positive power source E3 of the third data inverter INVD3 and to the output S3 of the third data inverter INVD3 via a PMOS third additional data transistor T15 and via an NMOS fourth additional data transistor T16, respectively.

When the additional write clock signal SHEB is in its low state, the first and third data transistors T13 and T15 are in their on state, thereby allowing the write bit line BLWR and the additional write bit line BLWRB to be precharged with the write data signal SDE.

It should be noted that the inputs of the negative power supply source of the second and fourth data inverters are jointly coupled to a bit line node NBL to which a write assist mechanism is possibly applied, in this case, for example, a negative voltage could be applied to the bit line node NBL.

The precharge substage circuit SEP forms part of the read and write circuitry that additionally comprise, in particular, a conventional control circuit allowing various control logic signals to be generated.

The static random access memory cell circuit CCM (FIG. 2) also comprises: a comparison circuit MC coupled to the cell stage circuit EC and intended to compare the first datum with a second datum corresponding to the first datum actually written to the cell stage circuit EC at the end of a write operation; and a processing circuit MT coupled between the comparison circuit MC and the data stage circuit ED and intended to possibly apply a write assist mechanism to the data stage circuit ED, depending on the result of the comparison.

Figure 4:
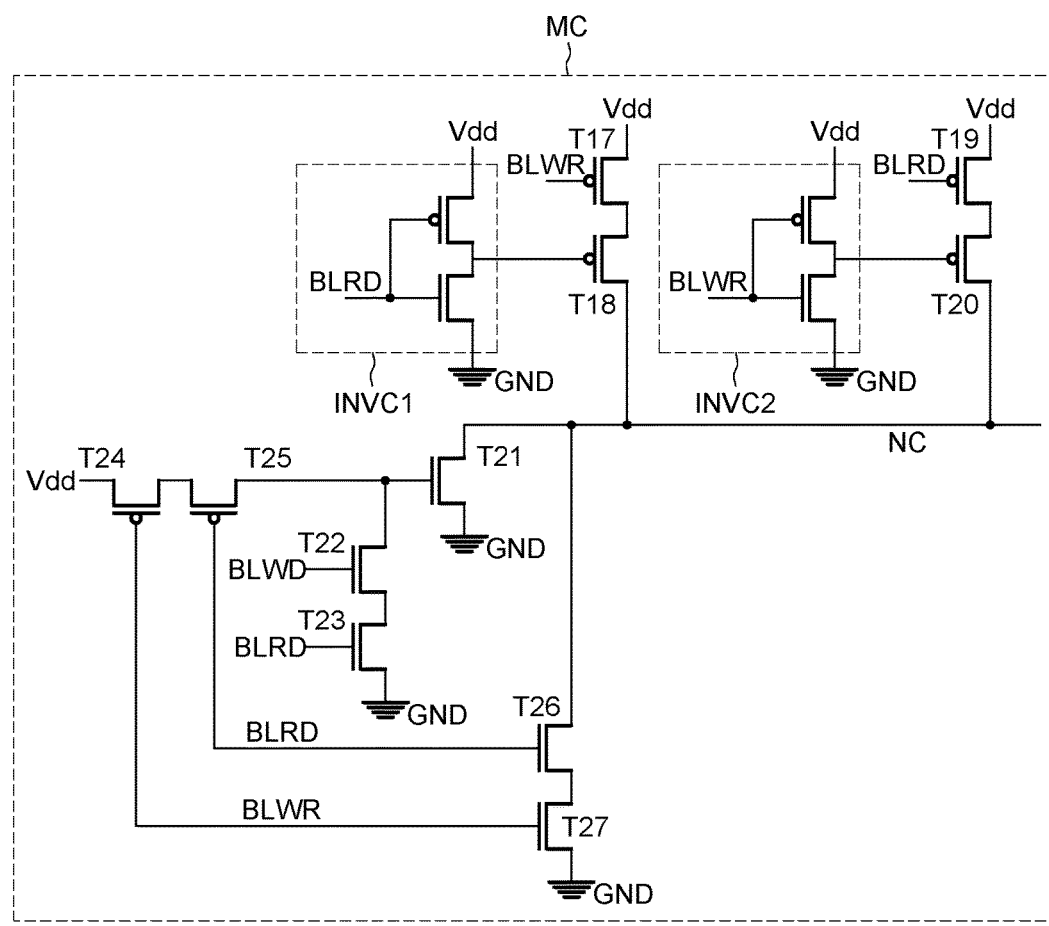
FIG. 4 schematically shows a comparison circuit.

FIG. 4 schematically shows an exemplary comparison circuit MC. The comparison circuit MC comprises: a first comparison inverter INVC1 whose input is coupled to the read bit line BLRD; a PMOS first comparison transistor T17 whose gate is coupled to the write bit line BLWR and whose source is coupled to the voltage Vdd; a PMOS second comparison transistor T18 whose gate is coupled to the output of the first comparison inverter INVC1, whose source is coupled to the drain of the first comparison transistor T17 and whose drain is coupled to a comparison node NC.

The comparison circuit MC additionally comprises: a second comparison inverter INVC2 whose input is coupled to the write bit line BLWR; a PMOS third comparison transistor T19 whose gate is coupled to the read bit line BLRD and whose source is coupled to the voltage Vdd; a PMOS fourth comparison transistor T20 whose gate is coupled to the output of the second comparison inverter INVC2, whose source is coupled to the drain of the third comparison transistor T19 and whose drain is coupled to said comparison node NC.

The comparison circuit MC still further comprises: an NMOS fifth comparison transistor T21 whose drain is coupled to said comparison node NC and whose source is coupled to ground GND; NMOS sixth and seventh comparison transistors T22 and T23 coupled in series between the gate of the fifth comparison transistor T21 and ground GND; PMOS eighth and ninth comparison transistors T24 and T25 coupled in series between the voltage Vdd and the gate of the fifth comparison transistor T21; and NMOS tenth and eleventh comparison transistors T26 and T27 coupled in series between the comparison node NC and ground GND.

The write bit line BLWR is additionally coupled to the gates of the sixth, eighth and eleventh comparison transistors T22, T24 and T27. The read bit line BLRD is additionally coupled to the gates of the seventh, ninth and tenth comparison transistors T23, T25 and T26.

The comparison circuit MC thus forms a logic comparator intended to compare the datum presented to the write bit line BLWR with that presented to the read bit line BLRD.

Of course, the embodiment illustrated in FIG. 4 is only a non-limiting example and any conventional logic comparator structure may be used.

The comparison node NC represents a low logic value (NC=0) if, and only if, the data on the write bit line BLWR and on the read bit line BLRD are identical. Otherwise, the logic value of the comparison node NC is high (NC=1).

Figure 5:
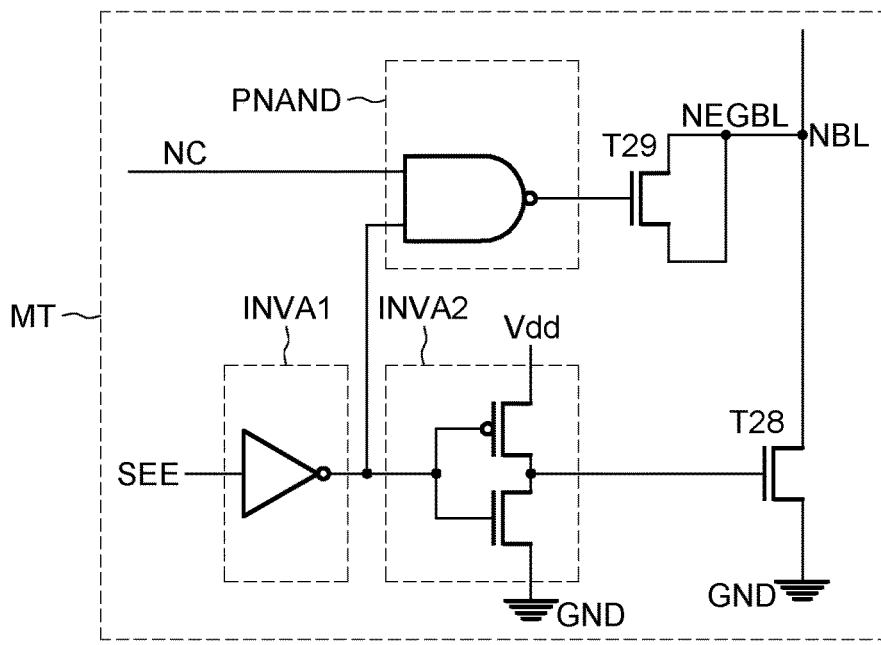
FIG. 5 schematically illustrates a processing circuit.

Reference will now be made to FIG. 5 to illustrate an exemplary processing circuit MT.

The processing circuit MT comprises: a first assist inverter INVA1 whose input is intended to receive a write evaluation signal SEE; a second assist inverter INVA2 coupled between the output of the first inverter INVA1 and the gate of an NMOS first assist transistor T28; a NAND logic gate PNAND whose two inputs are coupled to the comparison node NC and to the output of the assist inverter INVA1, respectively, and whose output is coupled to an NMOS second assist transistor T29.

The source and drain of the second assist transistor T29 are jointly coupled to the source of the first assist transistor T28. The second assist transistor T29 operates, in this instance, as a MOS capacitor and is configured to possibly apply a negative voltage NEGBL to the bit line node NBL.

It should be noted that the frequency of said write evaluation signal SEE is higher than that of the write clock signal SHE so as to allow the result of a write to be evaluated and, possibly, the result to be corrected by applying a negative voltage to the write bit line BLWR in one and the same write clock cycle.

The write evaluation signal SEE toggles from the high value 1 to the low value 0 when the result of the write has been evaluated. In this case, the logic gate PNAND receives a high value 1 at one of its two inputs. If the data on the write bit line BLWR and on the read bit line BLRD are different, the logic value of the comparison node NC is high (NC=1). Consequently, the output of the logic gate PNAND has a low value which generates a temporarily negative voltage at the output of the second assist transistor T29.

The first assist transistor T28 receives a low value at its gate when the write evaluation signal SEE is in its low state. Since a negative voltage NEGBL is applied to the write bit line BLWR and to the source of the first assist transistor T29, the first assist transistor T28 therefore turns on and pulls the voltage across the write bit line BLWR to ground GND. Stated otherwise, the first assist transistor T28 is configured to reset the write bit line BLWR to its initial state after each application of a negative voltage.

It should be noted that such a negative voltage may advantageously be applied to the write bit line of a column of SRAM cells in which said circuit CCM is located. The maximum value depends on the difference in voltage to be held between the terminals of the NMOS transistors T5 and T6 (see, FIG. 2), which is a parameter indicative of technological reliability.

Moreover, there are no size constraints to be respected for the transistors of the processing MT and comparison MC means. Transistors of the minimum size permitted by the technology employed may be used. Consequently, there is little impact on the area of silicon used.

Figure 6:
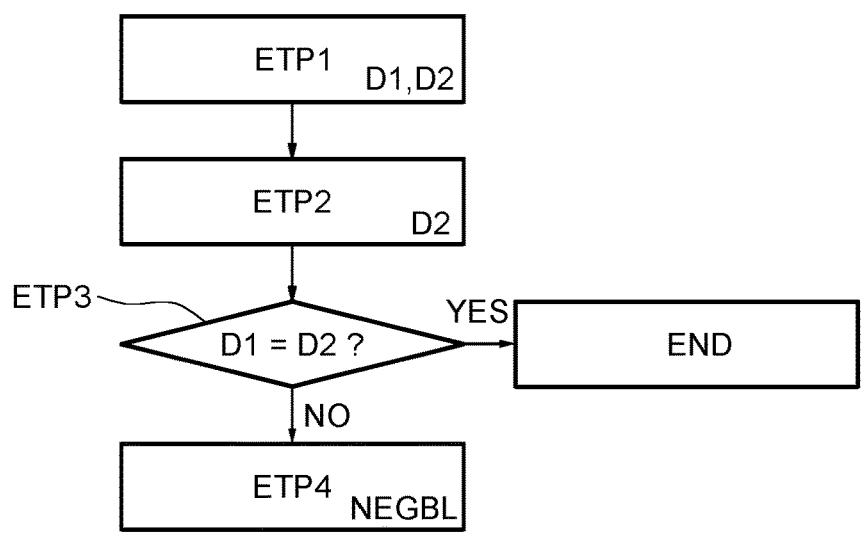
FIG. 6 illustrates an exemplary method for autocorrective writing to the static random access memory cell circuit.

FIG. 6 is now referenced in order to schematically illustrate an exemplary method for autocorrective writing to the static random access memory cell circuit CCM such as defined above.

In a first step ETP1, the write circuit operates to write a first datum D1 to said static random access memory cell circuit CCM when the write word line WLWR is activated. A second datum D2 is actually stored in the cell circuit CCM after the write operation. The second datum D2 may or may not be identical to the first datum.

In a second step ETP2, during the write clock cycle, the read circuit operates to read the second datum D2 when the read word line WLRD is activated subsequent to the write operation.

Said cell circuit CCM compares the first and second data via the comparison circuit MC in a third step ETP3 so as to determine whether the second datum D2 held by the circuit CCM corresponds to the first datum D1.

In a fourth step ETP4, when the write evaluation signal SEE is activated during the write clock cycle, the processing circuit MT of said circuit CCM applies a negative voltage NEGBL to the write bit line BLWR and the additional write bit line BLWRB if the held second datum D2 is different from the first datum D1.

In this case, the write circuit operates to rewrite the first datum with the application of the write assist mechanism, in this instance said negative voltage NEGBL, so as to make the first and second data D1 and D2 correspond.

If, in the third step ETP3, the first and second data are identical, the processing circuit MT does not modify the voltage across the write bit line BLWR and the additional write bit line BLWRB.

Thus, a cell circuit CCM is obtained that is capable of autocorrecting the result of a write by applying a write assist mechanism only if required, which therefore allows the consumption of said circuit to be significantly decreased, especially in the case of a large-scale implementation of the circuits within a multiport static random access memory device.

The invention claimed is:

1. A method for autocorrective writing to a multiport static random access memory device that includes at least one multiport static random access memory cell circuit, the method comprising the following steps:
    writing a first datum to the at least one multiport static random access memory cell circuit using a driver circuit and without application of a write assist;
    reading a second datum stored in the at least one multiport static random access memory cell circuit subsequent to writing;
    comparing the first and second data; and
    selectively rewriting the first datum to the at least one multiport static random access memory cell circuit using said driver circuit along with application of the write assist in dependence on the result of the comparison,
    wherein application of the write assist comprises applying a write assist voltage to a power supply node of the driver circuit during said rewriting.

2. The method according to claim 1, wherein writing the first datum and reading the second datum are carried out in one and the same write clock cycle.

3. The method according to claim 1, wherein selectively rewriting comprises not performing a rewriting of the first datum along with the application of said write assist to the at least one multiport static random access memory cell circuit if the result of the comparison indicates that the first and second data are identical.

4. The method according to claim 1, wherein selectively rewriting comprises performing a rewriting of the first datum along with the application of said write assist to the at least one multiport static random access memory cell circuit if the result of the comparison indicates that the first and second data are different.

5. The method according to claim 1, wherein said write assist voltage comprises a negative voltage.

6. The method according to claim 1, wherein the multiport static random access memory device comprises a matrix plane of multiport static random access memory cells arranged in rows and columns, the columns being parallel to write bit lines, and the write assist mechanism is applied to the bit lines that are coupled to all of the cell multiport static random access memory cell circuits of one and the same column.

7. A multiport static random access memory device, comprising at least one multiport static random access memory cell circuit, comprising:

a write circuit configured to write a first datum to the at least one multiport static random access memory cell circuit through actuation of a driver circuit and without application of a write assist;

a read circuit configured to read a second datum stored in the at least one multiport static random access memory cell circuit subsequent to writing the first datum;

a comparison circuit configured to compare the first and second data;

a processing circuit configured to selectively cause the write circuit to rewrite the first datum to the at least one multiport static random access memory cell circuit through actuation of a driver circuit along with application of the write assist in dependence on the result of the comparison; and a write assist circuit configured to apply the write assist by applying a write assist voltage to a power supply node of the driver circuit during said rewrite of the first datum.

8. The device according to claim 7, wherein the write circuit and the read circuit are additionally configured to write the first datum and read the second datum, respectively, in one and the same write clock cycle.

9. The device according to claim 7, wherein the processing circuit does not cause the write circuit to rewrite the first datum to the at least one multiport static random access memory cell circuit along with application of a write assist if the first and second data are identical.

10. The device according to claim 7, wherein the processing circuit does cause the write circuit to rewrite the first datum to the at least one multiport static random access memory cell circuit along with application of a write assist if the first and second data are different.

11. The device according to claim 7, wherein said write assist voltage is a negative voltage.

12. The device according to claim 7, wherein said at least one multiport static random access memory cell circuit is part of a matrix plane of memory cells arranged in rows and columns, the columns being parallel to write bit lines, and said write assist mechanism is applied by the processing circuit to the bit lines of the multiport static random access memory cell circuits of one and the same column.

13. A system including at least one multiport static random access memory device with at least one multiport static random access memory cell circuit, comprising:

a write circuit configured to write a first datum to the at least one multiport static random access memory cell circuit through actuation of a driver circuit and without application of a write assist;

a read circuit configured to read a second datum stored in the at least one multiport static random access memory cell circuit subsequent to writing the first datum;

a comparison circuit configured to compare the first and second data;

a processing circuit configured to selectively cause the write circuit to rewrite the first datum to the at least one multiport static random access memory cell circuit through actuation of a driver circuit along with application of the write assist dependence on the result of the comparison; and a write assist circuit configured to apply the write assist by applying a write assist voltage to a power supply node of the driver circuit during said rewrite of the first datum.

14. The system of claim 13, wherein this system is a component of an electronic apparatus selected from a group consisting of: a mobile cell phone, a tablet, and a laptop computer.

15. A method for autocorrective writing to a multiport static random access memory device that includes at least one multiport static random access memory cell circuit coupled to a pair of write bit lines and at least one read bit line, the method comprising the following steps:

writing a first datum to the at least one multiport static random access memory cell circuit through actuation of driver circuitry coupled to the pair of write bit lines and without simultaneously applying a negative voltage to a supply node of the driver circuit during said writing of the first datum;

reading a second datum stored in the at least one multiport static random access memory cell circuit subsequent to writing through the at least one read bit line;

comparing the first and second data; and if the first and second data do not match, then rewriting the first datum to the at least one multiport static random access memory cell circuit through actuation of driver circuitry coupled to the pair of write bit lines along with simultaneously applying the negative voltage to the supply node of the driver circuitry during said rewriting of the first datum.

16. The method according to claim 15, wherein writing the first datum and reading the second datum are carried out in one and the same cycle of a write clock which controls timing of the writing of the first datum to the at least one multiport static random access memory cell circuit through the pair of write bit lines.

17. The system of claim 13, wherein said write assist voltage is a negative voltage.

18. A multiport static random access memory device, comprising at least one multiport static random access memory cell circuit coupled to a pair of write bit lines and at least one read bit line, comprising:

a write circuit configured to write a first datum to the at least one multiport static random access memory cell circuit through driver circuitry coupled to the pair of write bit lines and without simultaneously applying a negative voltage to a supply node of the driver circuitry during said writing of the first datum;

a read circuit configured to read, subsequent to writing the first datum, a second datum stored in the at least one multiport static random access memory cell circuit through the at least one read bit line;

a comparison circuit configured to compare the first and second data; and a processing circuit configured, if the first and second data do not match, to cause the write circuit to rewrite the first datum to the at least one multiport static random access memory cell circuit through actuation of the driver circuitry coupled to the pair of write bit lines along with simultaneously applying the negative voltage to the supply node of the driver circuitry during said rewriting of the first datum.

19. The device according to claim 18, wherein the write circuit and the read circuit are additionally configured to write the first datum and read the second datum, respectively, in one and the same cycle of a write clock which controls timing of the writing of the first datum to the at least one multiport static random access memory cell circuit through the pair of write bit lines.

* * * * *